United States Patent [19]

Underwood

[11] Patent Number: 5,910,740
[45] Date of Patent: Jun. 8, 1999

[54] PHASE LOCKED LOOP HAVING MEMORY

[75] Inventor: George D. Underwood, Inglewood, Calif.

[73] Assignee: Raytheon Company, Lexington, Mass.

[21] Appl. No.: 08/878,323

[22] Filed: Jun. 18, 1997

[51] Int. Cl.$^6$ ........................................ H03L 7/06
[52] U.S. Cl. .................. 327/149; 527/158; 527/147; 375/576; 375/375; 370/518
[58] Field of Search .................. 375/373, 374, 375/375, 376, 371, 327, 294, 215; 371/1; 327/147, 149, 150, 152, 153, 156, 158, 161; 370/503, 516, 517, 518

[56] References Cited

U.S. PATENT DOCUMENTS

| | | | |
|---|---|---|---|
| 5,087,829 | 2/1992 | Ishibashi et al. | 307/269 |
| 5,118,975 | 6/1992 | Hillis et al. | 307/602 |
| 5,511,100 | 4/1996 | Lundberg et al. | 375/376 |
| 5,552,726 | 9/1996 | Wichman et al. | 327/149 |
| 5,604,775 | 2/1997 | Saitoh et al. | 375/376 |
| 5,610,543 | 3/1997 | Chang et al. | 327/158 |
| 5,646,564 | 7/1997 | Erickson et al. | 327/158 |
| 5,675,274 | 10/1997 | Kobayashi et al. | 327/158 |
| 5,717,353 | 2/1998 | Fujimoto | 327/276 |
| 5,771,264 | 6/1998 | Lane | 375/376 |
| 5,844,954 | 12/1998 | Casasanta et al. | 375/373 |

*Primary Examiner*—Chi H. Pham
*Assistant Examiner*—Emmanuel Bayard
*Attorney, Agent, or Firm*—Leonard A. Alkov; William C. Schubert; Glenn H. Lenzen, Jr.

[57] ABSTRACT

A phase locked loop that enables highly precise tracking and phase locking of a synthesized clock signal to a reference clock signal. The phase locked loop has a memory that enables highly precise tracking and phase locking of a synthesized clock signal to its reference clock signal. The phase locked loop predicts the exact delay setting required for a frequency match, so that over-shoots and under-shoots around a desired frequency are minimized, and correction sizes are bounded to a relatively small region in the proximity of the desired frequency. The phase locked loop uses a dynamically programmable digital delay line to implement a variable frequency oscillator. The programmable delay line is used to produce a desired synthesized clock period. The phase locked loop provides an oscillator source whose period is determined by a delay derived from a clock distribution circuit plus a delay derived from the programmable delay line. A phase detector provides phase relationship information to control logic that indicates whether the synthesized clock signal leads or lags the reference clock signal. Divide by K logic provides every $K^{th}$ synthesized clock edge to the phase detector which corresponds to the occurrence of the reference clock edge. The control logic implements novel methods to control the delay associated with each half clock period in a way that minimizes phase error. Optional reference clock insertion capability provided by a multiplexer enables perfect phase alignment to be achieved each time a reference clock edge occurs.

6 Claims, 2 Drawing Sheets

PHASE LOCKED LOOP HAVING MEMORY

BACKGROUND

The present invention relates generally to phase locked loops, and more particularly, to a phase locked loop having memory.

Current phase lock loop algorithms are almost exclusively analog in nature (using an operational amp to perform a comparison, i.e., a VCO) and determine the clock period adjustment based on a single measurement at the time a reference clock edge occurs (no historical information is kept and no attempt is made to use historical information to influence the decision). Such systems are subject to very large phase errors and are heavily influenced by random noise. Due to their analog nature, such systems are also difficult to highly integrate (for example with a divide by K function or with a highly desirable reference edge registration feature of the present invention). Such analog systems are also relatively susceptible to loss of phase lock or incapability of obtaining phase lock, due to random variations in the system (i.e. voltage noise). The implementation of the present invention results in relatively small phase errors, high integration, and robustness to random variations (system noise).

The motivation for the development of the present invention is to allow clock phase locked loop frequency and phase matching (locking) to a finer resolution bounded by a smaller maximum phase error) than has heretofore been practical to achieve. The advantages of the teachings of the present invention include extremely accurate delay approximation to the reference clock frequency, bounding of phase error adjustments, robustness to short lived transients (such as voltage noise), and registration to the reference clock edge (when it occurs).

Accordingly, it is an objective of the present invention to provide for a phase locked loop having memory that allows clock phase locked loop frequency and phase matching (locking) to a finer resolution than prior devices as well as filtering of the effects of short lived instantaneous noise.

SUMMARY OF THE INVENTION

To meet the above and other objectives, the present invention provides for a phase locked loop that incorporates a memory that enables highly precise tracking and phase locking of a synthesized (typically higher frequency) clock signal to its reference clock signal. The present invention uses a novel approach to predict the exact delay setting required for a frequency match, and therefore over-shoots and under-shoots around an ideal frequency are minimized. Furthermore, correction sizes are bounded to a relatively small region in the proximity of the actual desired frequency which dampens oscillations around the desired frequency while still tracking frequency changes brought about by a dynamic environment (changing temperate or voltage variances which affect intrinsic silicon delays used to define the oscillation frequency).

The phase locked loop uses a dynamically programmable digital delay line to implement a variable frequency oscillator. The delay line is a high bandwidth, high resolution programmable delay line used to produce a desired synthesized clock period. The phase locked loop forms an oscillator source whose period is determined by a delay derived from a clock distribution circuit plus a delay derived from the programmable delay line. A phase detector provides phase relationship information to control logic that indicates whether the synthesized clock signal leads or lags the reference clock signal. Divide by K logic provides multiply up functionality by providing every $K^{th}$ clock edge to the phase detector. The control logic implements novel algorithms to control the delay associated with each half clock period in such a way as to minimize the phase error. Optional reference clock insertion capability enables perfect phase alignment to be achieved each time a reference clock edge occurs.

The present phase locked loop was developed for use with a state-of-the-art digital frequency multiplying, phase locking system. Such a system uses discrete digital delay elements to implement a programmable silicon delay-based oscillator. An exact matching of the synthesized frequency to the reference frequency was not feasible using the discrete digital delay elements and therefore there was a requirement to perform delay adjustments based on feedback from a phase detector. The phase detector indicates if the synthesized clock frequency leads or lags the reference clock frequency, but not by how much. If the synthesized clock frequency lags the reference clock frequency, the control logic causes the synthesized clock period to be lengthened. If the synthesized clock frequency leads the reference clock frequency, the control logic causes the synthesized clock period to be shortened.

At the time of a phase transition (either from leading to lagging or vice-versa), the present invention generates substantial phase alignment. When this phase alignment is detected it is desirable to insert a delay setting which closely matches the frequency of the synthesized clock (after division by K) to the frequency of the reference clock. Previously, ad hoc approaches were used to increase the delay of the synthesized clock if a leading to lagging transition occurred and vice versa, without any capability of accurately determining the ideal synthesized clock delay setting. The present invention determines the ideal synthesized clock frequency via an averaging process. Initially, corrections are made in an unbiased manner (which lead to large + and − phase errors of the synthesized clock relative to the reference clock). It is the teachings of the present invention that, while the delay settings chosen to correct for leading and lagging error vary widely from the desired delay in both the + and − directions, the average of all delay settings chosen in an unbiased manner closely approximate the exact delay required to match the reference clock frequency. This "theory" may be rigorously proven using probability theory (the Central Limit Theorem) and has been shown to hold empirically via simulation.

By determining the appropriate time to insert the "ideal" delay setting and by determining the value of the "ideal" delay setting, ringing of phase error around the desired phase is severely dampened. Furthermore, the size of corrections (which are required, since the synthesized clock always leads or lags the reference clock) are limited in size, further dampening oscillations, which would otherwise lead to relatively large phase errors. This limiting process, in essence, filters out spurious short lived changes associated with voltage noise, but allows tracking of consistently biased movement, which affects the outcome of the average delay setting determination. The sample time for the averaging process is chosen in a manner that provides quick response to long term environmentally influenced changes and allows canceling or filtering of short term deviations.

Finally, optionally substituting the reference clock edge for the synthesized clock edge (when a slower frequency reference clock edge occurs) resets the synthesized clock to the correct phase alignment. This process does not affect the function of the phase detector, which is used to determine the optimum delay line settings. The delay line setting determines the location of intermediate synthesized clock edges.

In summary, there are three key novel ideas associated with the approach of the present invention, which work together synergistically to optimize the performance of the phase locked loop. These include phase alignment detection, calculation of the ideal delay line settings to emulate the reference clock frequency, and phase registration when a reference clock edge occurs. This approach has been found to be ideal for dynamic tracking systems (in particular digital multiplying and phase locking systems) resulting in excellent phase tracking under expected environmental conditions with voltage and temperate generated noise and semiconductor performance effects.

Clock distribution architectures using phase locking are a key factor in defining the performance of digital (processor) systems, and which are improved by the present invention. The present invention may be used in military and avionic applications such as timing systems for use in thermal imaging and tracking system. Such systems are widely used in commercial industry as well, such as to provide internal clock distribution for high performance microprocessor chips, on video cards for pixel clock generation, or in communication transceiver equipment, for example.

Digital phase locked clocking systems are relatively new and promise to extend the processing performance and fault tolerance of clocking systems. Current systems are limited by reflections and crosstalk at higher frequencies. These systems are unable to multiply from lower distributed frequencies to high frequencies when needed, due to fundamental limitations of state-of-the-art analog comparator based phase locked loop systems in the presence of system noise. The phase tracking achievable using phase registration, frequency approximation, and phase correction bounding provided by the present invention solves this problem, which increases frequency resolution and bounds phase error. Thus, the teachings of the present invention provide for many advantages in phase tracking and practical implementation considerations over current state-of-the-art phase locked clocking systems.

The technology of the present invention provides for distribution of low frequency clock signals with multiplication up to higher frequencies at the destination and may be used in clock fault tolerance applications. The approach of the present invention has been found to be ideal for dynamic tracking systems, and in particular, digital multiplying and phase locking systems.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which.

DETAILED DESCRIPTION

Figure 1:
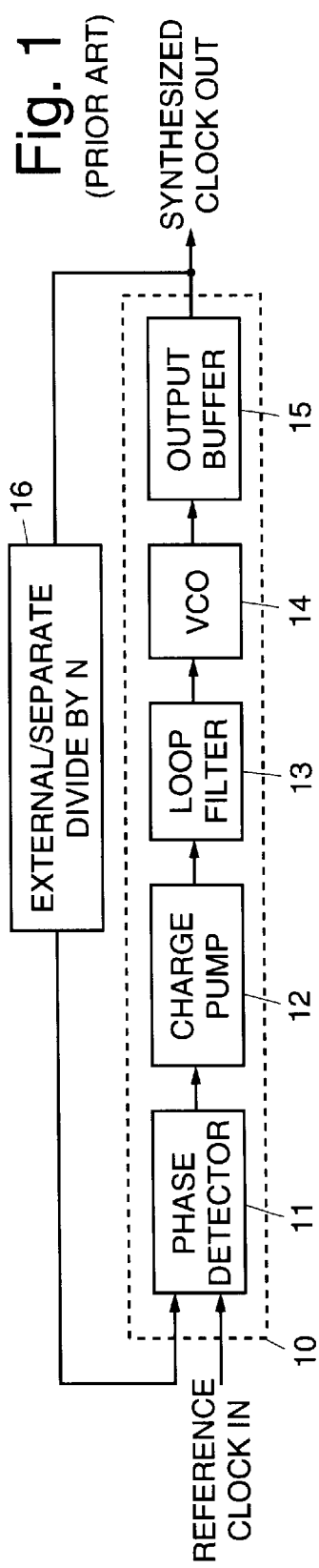
FIG. 1 illustrates a conventional analog phase locked loop device that is improved upon by the present invention.

Referring to the drawing figures, FIG. 1 illustrates a conventional analog phase locked loop 10 that is improved upon by the present invention. The conventional analog phase locked loop 10 is identified as an AV9173 available from Integrated Circuits Systems Inc. as published in their 1994 Databook, for example, and is a highly integrated (by traditional standards) phase locked loop 10 that generates pixel clock signals that are phase locked to horizontal line synchronization (reference) input signals.

The analog phase locked loop 10 receives reference clock input signals and generates synthesized clock output signals. The analog phase locked loop 10 has a phase detector 11 that receives the reference clock input signals and divided clock signals generated by an external divide by K circuit 16 derived from the synthesized clock output signals. The output of the phase detector 11 is serially processed by a charge pump 12 and a loop filter 13, whose output drives a voltage controlled oscillator (VCO) 14. The output of the voltage controlled oscillator 14 is coupled though an output buffer to produce the synthesized clock output signals.

Conventional phase lock loop algorithms, such as those implemented by the phase locked loop 10, are almost exclusively analog in nature (using an operational amplifier to perform a comparison, i.e., the VCO 14) and determine the clock period adjustment based on a single instantaneous measurement at the time a reference clock edge occurs. Consequently, no historical information is kept and no attempt is made to use historical information to influence the clock period adjustment. Such systems are subject to very large phase errors and are heavily influenced by random noise which affects the instantaneous measurement. Due to their analog nature, such conventional phase lock loops 10 are also difficult to highly integrate (for example, with a divide by K function or with a highly desirable reference edge registration feature of the present invention). Such conventional phase lock loops 10 are also relatively susceptible to loss of phase lock or are not able to obtain phase lock, due to random variations in the system (i.e. voltage noise). In contrast to conventional systems, the phase lock loop implementation of the present invention exhibits relatively small phase errors, may be highly integrated, and has robustness to random variations, as will be described in more detail below.

Figure 2:
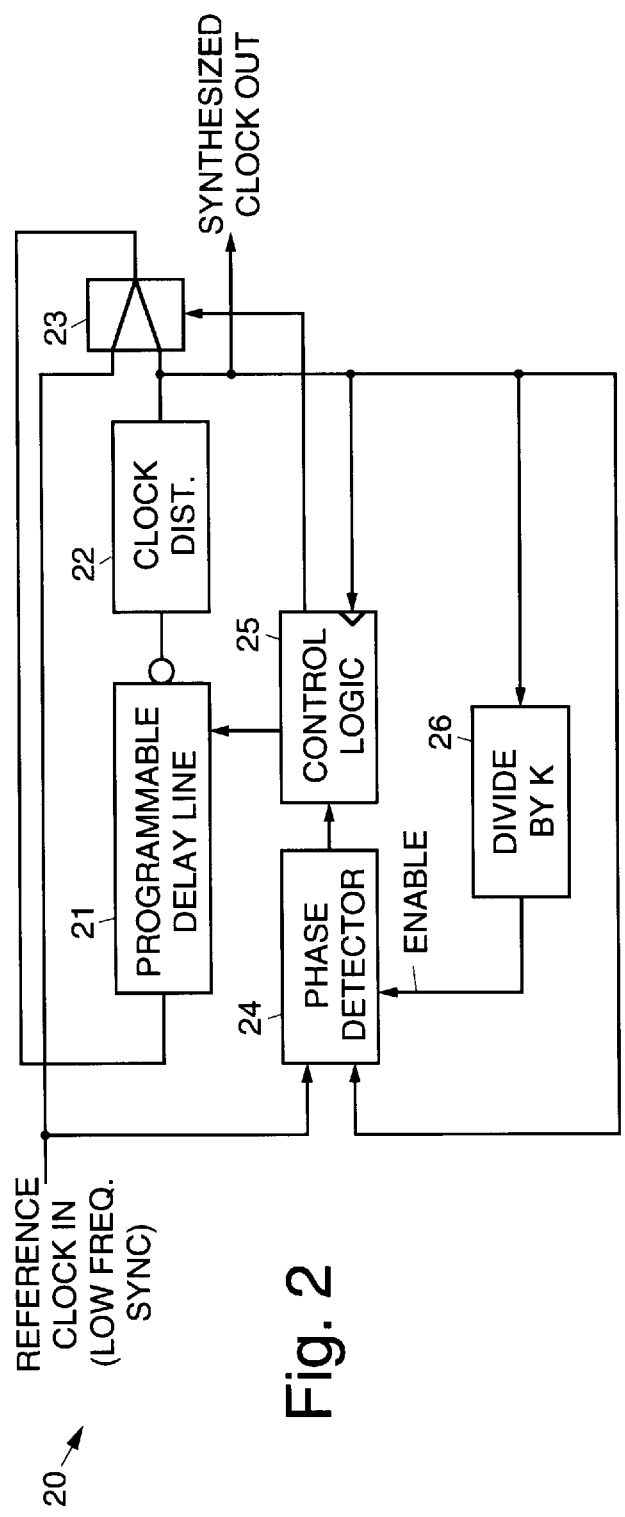
FIG. 2 illustrates the architecture of a phase locked loop in accordance with the principles of the present invention.

FIG. 2 illustrates the architecture of a phase locked loop 20 in accordance with the principles of the present invention. The phase locked loop 20 has a reference clock input that receives reference clock input signals. The reference clock input signals are coupled to one input of a multiplexer 23. Output signals from the multiplexer 23 are coupled to an input of a dynamically programmable delay line 21. The dynamically programmable delay line 21 delays the output signals by a programmed amount, and has an output coupled to a clock distribution circuit 22. The clock distribution circuit 22 has an output that is coupled to a second input of the programmable delay line 21 and the multiplexer 23 and also provides synthesized clock output signals from the phase locked loop 20. The reference clock signals are coupled to a phase detector 24 whose output is coupled to control logic 25 that controls the multiplexer 23. The synthesized clock output signals are coupled to a divide by K circuit 26 that outputs enable signals that enable the phase detector 24.

The phase locked loop 20 uses the dynamically programmable digital delay line 21 to implement a variable frequency oscillator. The phase locked loop 20 comprises an oscillator source having a period determined by a clock distribution delay derived from the clock distribution circuit 22 plus a programmable delay derived from the delay line 21. The phase detector 24 provides phase relationship information to the control logic 25 whether the synthesized clock signal leads or lags the reference clock signal. Divide by K logic 26 provides multiply-up functionality by coupling every $K^{th}$ clock edge to the phase detector 24. The control logic 25 implements novel methods (FIG. 3) that control the delay associated with each half clock period in a manner that minimizes phase error. The delay line 21 is a high bandwidth, high resolution programmable delay line that produces the desired synthesized clock edges and determine the clock period. Optional reference clock insertion provided by the multiplexer 23 with a select signal from control logic 25 enables perfect phase alignment to be achieved each time a reference clock edge occurs.

The phase locked loop 20 was developed for use with a state-of-the-art digital frequency multiplying, phase locking system. This system requires a phase locked loop 20 that performs delay adjustments based on feedback from the phase detector 24. The phase detector 24 indicates if the synthesized frequency leads or lags the reference frequency, but not by how much. If the synthesized clock signal lags the reference clock signal, the control logic causes the synthesized clock period to be lengthened. If the synthesized clock signal leads the reference clock signal, the control logic causes the synthesized clock period to be shortened. In any case, the magnitude of the adjustment is influenced not only by the latest instantaneous measurement, but also by historical data which is stored in the delay line 21 and periodically updated.

At the time of a phase transition (either from leading to lagging or vice-versa), the teaching of the present invention takes advantage of the near phase alignment. When (near) phase alignment is detected it is desirable to insert a delay setting which closely matches the frequency of the synthesized clock signal (after division by K) to the frequency of the reference clock signal. Previously, ad hoc approaches were used to determine the amount to increase/decrease the delay of the synthesized clock signal if a lagging/leading transition occurred, without any capability of accurately determining the ideal synthesized clock delay setting. The present invention determines the ideal synthesized clock frequency via an averaging process. Initially, corrections are made in an unbiased manner (which lead to large + and − phase errors of the synthesized clock relative to the reference clock). In accordance with the teachings of the present invention, while the delay settings chosen to correct for leading and lagging error vary widely from a desired delay in both the + and − directions, the average of all delay settings chosen in an unbiased manner closely approximates the exact delay required to match the reference clock frequency to the synthesized clock frequency. This theory is supported by the Central Limit Theorem and has been shown to empirically hold true based on results of simulations.

By determining the appropriate time to insert the "ideal" delay setting and by determining the value of the "ideal" delay setting, the ringing of phase error around the desired phase is severely dampened. Furthermore, the size of corrections (which are required, since the synthesized clock is always either leading or lagging the reference clock) are limited in size, further dampening oscillations, which would otherwise lead to relatively large phase errors. This limiting process in essence filters out spurious short lived changes associated with voltage noise, but allows tracking of consistently biased movement, which affects the outcome of the average delay setting determination. The sample time for the averaging process is chosen in such a way as to provide both a quick response to long term environmental changes and to allow canceling or filtering of short term deviations.

Finally, optionally substituting the reference clock edge for the synthesized clock edge (when the slower frequency reference clock edge occurs) resets the synthesized clock to the correct phase alignment. This process does not affect the function of the phase comparator, which is used to determine the optimum delay line settings. The delay line setting determines the location of the intermediate synthesized clock edges between reference clock edge occurrences.

In summary, there are three key novel ideas associated with the approach of the present invention, which work together synergistically to optimize the performance of the present phase locked loop 20. These include phase alignment detection, calculation of the ideal delay line settings to emulate the reference clock frequency, and phase registration when a reference clock edge occurs. This approach has been found to be ideal for dynamic tracking systems (in particular digital multiplying and phase locking systems) resulting in excellent phase tracking under expected environmental conditions.

The performance criteria of the AV9173 device is presented in Table 1 and is compared to the performance criteria of the present invention. The data for the present phase locked loop presented in Table 1 is based on computer modeling and simulation. The present phase locked loop data assumes an expected voltage spiking/instability model, which does not take into account potentially favorable natural filtering of voltage spikes by the circuitry or additional filtering measures (such as adding a large capacitor to the supply voltage). The present phase locked loop is based on a 33 MHz pixel clock (1024 pixel clocks per horizontal sync).

Table 1 provides a comparison of the present phase locked loop to the AV9173 state-of-the-art analog system. The present phase locked loop outperforms the AV9173 analog system by a factor of 10.

TABLE 1

| | AV9173 | | | Present invention | | |
|---|---|---|---|---|---|---|
| | min | typ | max | min | typ | max |
| Line-to-line jitter | not spec | ±4 ns | not spec | −1 ns | ±250 ps | +1 ns |
| Cycle-cycle jitter | −500 ps | ±250 ps | +500 ps | −60 ps | 0 | +60 ps |
| Input jitter (Horiz sync.) | not spec | ±0 | not spec | See following paragraph | | |
| Input freq. (Horiz sync.) | 15 KHz | | 1 MHz | <5 KHz | | >50 MHz |
| Output freq. (Pixel clock) | 10 MHz | | 50 MHz | <5 KHz | | >50 MHz |
| Divide circuit | external, error not included | | | internal, error included | | |

The input jitter tolerance of the AV9173 is not specified. A small unspecified amount of jitter on the horizontal sync input will cause the AV9173 to fail to lock on. The lock on method used by the present invention insures lock on with very large reference clock jitter (on the order of half of a pixel clock period).

Assuming a 25 MHz pixel clock (800 pixels per line) RS-170, the phase error is ±4/40=±10% of a pixel clock period from one line to the next, using the AV9173. Considering nonadjacent lines, then the phase difference is within 20% (−4 ns error to +4 ns error). This 20% delta is exclusive of additional skewing associated with the external divide circuit 16 (which could easily add another 20%). The external divide circuit also adds a biased offset.

The above analysis indicates that in terms of phase error performance, reference frequency jitter tolerance, applicable frequency range, integration density, and clock cycle to clock cycle and line to line pixel clock jitter, the phase locked loop 20 outperforms the AV9173 pixel clock generation system, in some cases by a factor of 4 to 10 times. This improved performance makes the phase locked loop 20 more robust and useful in many applications.

While the above analysis illustrates a pixel clock implementation, one may extrapolate general performance comparisons to a system clock distribution application. For the system clock distribution application, the phase locked loop 20 has significant performance advantages over the AV9173 of FIG. 1. For system clock distribution, the advantages of the phase locked loop 20 make it feasible, while the relatively large phase error and jitter and lack of integration of the clock divide circuit of the AV9173, and the difficulty in integrating it into a digital ASIC, render it less feasible for processor applications.

Figure 3:
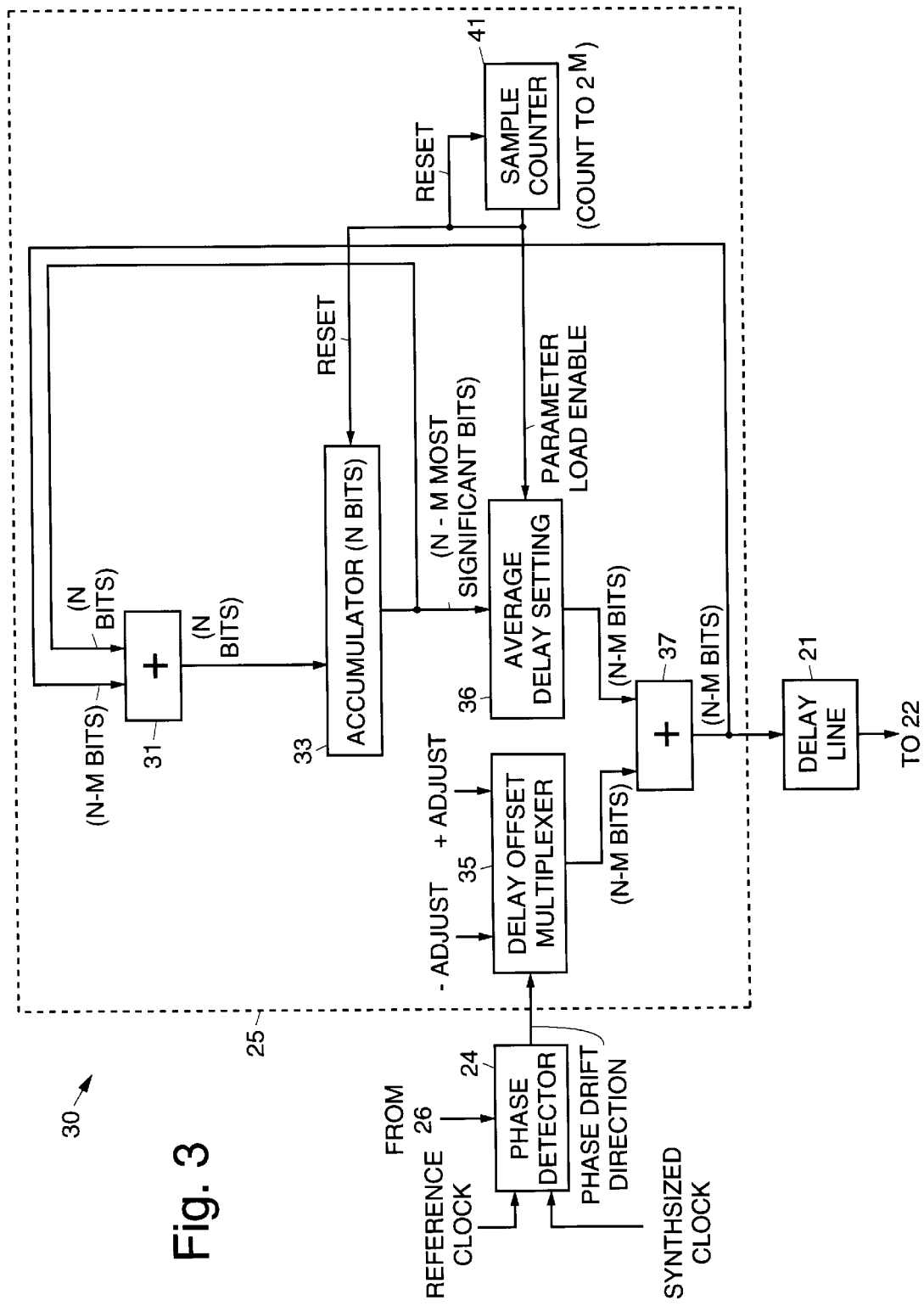
FIG. 3 illustrates the control logic implemented in the phase locked loop of FIG. 2.

FIG. 3 illustrates a control algorithm implemented in the phase locked loop 20 of FIG. 2. The phase lock control implementation is simple, flexible (programmable to the noise of the environment) and very powerful in achieving exceptional phase locking. With reference to FIG. 3, a sample counter 41 is reset periodically (when the final count is achieved) and counts to $2^M$, where M determines the frequency at which the average delay setting is updated. Delay setting 36 is the best estimate of the ideal frequency delay. The relatively infrequent updating of delay setting 36 results in the filtering of short lived transients and dampening of oscillation around the ideal frequency. Small temporary delay variances relative to delay setting 36, derived from a delay offset multiplexer 35, provide ongoing phase error correction.

An accumulator 33 is used to accumulate the sum of $2^M$ samples. Each sample is N–M bits wide. The result is an N-bit wide sum. N is constrained by hardware limitations and the desired accuracy. The sum is achieved by an adder 31. The N–M most significant bits of the output of the accumulator 33 produces an average delay setting 36. The output of the phase detector 24 is coupled to the delay offset multiplexer 35 which selects small plus or minus adjustments of the delay setting offset from the average delay setting 36. The output of the delay offset multiplexer 35 and the average delay setting 36 are summed in a second adder 37 and output to the programmable delay line 21. The first adder 31 sums the output of the second adder 37 and the accumulated sum of samples produced by the accumulator 33 (up to $2^M$ samples as determined by the sample counter 41).

Adjustment of the discrete digital delay line 21 is achieved in a way that optimizes phase tracking in response to feedback from the phase detector 24 (leading or lagging) and historical information stored in the accumulator 33. The phase locked loop 20 uses a novel approach to store historical information which is relevant to the delay value decision. In a preferred embodiment, the accumulator 33 accumulates the sum of $2^M$ samples. A sample is a delay line selection value, which is updated (and sampled) each time a reference clock edge occurs. The ideal sample size is a function of the system noise, and can be readily optimized. After $2^M$ samples have been accumulated, an accumulated value S is divided by $2^M$ to determine a new average delay line setting. Since $2^M$ is a power of 2, the division is accomplished by truncating the least significant M bits of S. The most significant N–M bits of the accumulator 33 are periodically (as determined by sample counter 41) loaded into the average delay setting 36. In order to make room for future samples, the accumulator 33 is reset. The ideal sample size and plus and minus adjustment sizes are a function of system noise, and can be optimized or dynamically modified algorithmically or in response to system monitoring sensors.

The phase locking algorithm implemented in the present phase locked loop is as follows (presented in terms of "C"-like pseudo code):

wait for a reference clock edge
  (i) increment the sample counter (sample counter ++)
  (ii) if(sample count ==$2^M$) //terminal count

```
{
    load the new average delay setting
    average delay = accumulator's MSB bits (discard M LSB bits)
    reset the sample counter with 0
    reset the accumulator with 0
}
```

(iii) observe the phase detector output:

```
if (phase detector output == leading)
        select . . . − adjust
        delay line <= average delay setting − adjust
else
        select . . . + adjust
        delay line <= average delay setting + adjust
```

(iv) add the selected delay line value to the accumulator;
(v) increment the sample counter
(vi) repeat indefinitely (autonomous updates).

Converging on the average delay settings (where unbiased corrections are used) optimizes phase locking performance.

The present invention has been modeled and simulated using LSI Logic 0.7–35 Micron Array-Base Product Data book LCA 200K compacted array performance data. Simulations confirm that the present invention can be practically implemented and live up to system performance expectations. The approach was implemented as the control system of FIG. 3 which is used in a dynamically programmable oscillator, the delay of which was manipulated in real time to maintain frequency and phase locking while being stressed by real world modeled environmental (voltage and temperature) variations. The performance of the phase locked loop was monitored over thousands of clock periods. The closeness of the achieved phase lock was found to be significantly superior to that achievable by using a conventional approach or previous memoryless digital approaches.

Thus, a phase locked loop having memory has been disclosed. It is to be understood that the described embodiment is merely illustrative of some of the many specific embodiments which represent applications of the principles of the present invention. Clearly, numerous and other arrangements can be readily devised by those skilled in the art without departing from the scope of the invention.

What is claimed is:

1. A phase locked loop comprising:

a reference clock input for receiving a reference clock input signal;

a multiplexer having an input coupled to receive the reference clock input signal;

a dynamically programmable delay line having an input coupled to receive an output signal from the multiplexer for delaying the output signal from the multiplexer by a programmed amount;

a clock distribution circuit having an input coupled to an output of the dynamically programmable delay line and having an output coupled to a second input of the multiplexer and wherein the clock distribution circuit provides a synthesized clock output signal from the phase locked loop;

a phase detector having inputs coupled to receive the reference clock signal and the synthesized clock output signal, for generating a signal indicative of whether the frequency of the synthesized clock output signal is leading or lagging the frequency of the reference clock input signal;

control logic coupled between the phase detector and a select input of the programmable delay line, for controlling the programmable delay line such that if the frequency of the synthesized clock output signal lags the frequency of the reference clock input signal, the control logic causes the period of the synthesized clock output signal to be lengthened, and if the frequency of the synthesized clock output signal leads the frequency of the reference clock input signal, the control logic causes the period of the synthesized clock output signal to be shortened, and coupled to a select input of the multiplexer for controlling the multiplexer such that if the reference clock edge occurs, it is substituted in place of the synthesized clock edge; and a divide by K circuit having an input coupled to receive the synthesized clock output signal for generating an enable signal that enables the phase detector.

2. A phase locked loop for processing reference clock signals to produce a predetermined number (K) of equally spaced synthesized clock output signals between occurrences of each reference clock signal, said phase locked loop comprising:

a phase detector for generating phase signals that indicate whether the $K^{th}$ respective synthesized clock output signal leads or lags the reference clock signal, and for determining optimum delay line settings which determines the location of edges of intermediate synthesized clock signals that occur between adjacent reference clock signals;

divide by K logic coupled to the phase detector for processing the synthesized clock output signals to cause the phase detector to output the phase signal upon the occurrence of every $K^{th}$ synthesized clock output signal;

control logic coupled to the phase detector for processing the phase signal to control the delay associated with each half clock period to minimize the phase error between the reference clock signals and the synthesized clock output signals;

a dynamically programmable digital delay line coupled to the control logic that comprises a variable frequency oscillator for producing a desired synthesized clock period; and a clock distribution circuit coupled to the delay line for outputting the synthesized clock output signal;

and wherein the phase locked loop forms an oscillator source whose period is determined by a delay derived from the clock distribution circuit plus the delay derived from the programmable delay line, and wherein, if the synthesized clock signal lags the reference clock signal, the control logic causes the period of the synthesized clock signal to be lengthened, and if the synthesized clock signal leads the reference clock signal, the control logic causes the period of the synthesized clock signal to be shortened.

3. The phase locked loop of claim 2 wherein the control logic determines an ideal synthesized clock frequency using an averaging process, wherein an average of all delay settings is chosen in an unbiased manner to closely approximate the exact delay required to match the reference clock frequency.

4. The phase locked loop 20 of claim 2 which further comprises:

reference clock insertion logic for selectively coupling the reference clock signal to the input of the delay line.

5. The phase locked loop of claim 2 which further comprises:

a multiplexer for receiving the reference and synthesized clock signals and for selecting the most accurate of the two to input to the programmable delay line.

6. The phase locked loop of claim 2 wherein the control logic comprises:

memory logic for processing the synthesized clock output signals to accumulate a running sum of $2^M$ samples of the synthesized clock output signals, and for generating an average delay setting;

a delay offset multiplexer for selecting small plus or minus adjustments of the delay setting offset from the average delay setting for the delay; and an output adder for summing the average delay setting and the delay offset value from the delay offset multiplexer.

* * * * *